US008295054B2

(12) United States Patent
Lu

(10) Patent No.: US 8,295,054 B2
(45) Date of Patent: Oct. 23, 2012

(54) PRINTED CIRCUIT BOARD FASTENING STRUCTURE

(75) Inventor: Shao-Feng Lu, Taoyuan Hsien (TW)

(73) Assignees: FSP Technology Inc., Taoyuan, Taoyuan Hsien (TW); 3Y Power Technology (Taiwan), Inc., Gueishan Shiang, Taoyuan Hsien (TW)

( * ) Notice: Subject to any disclaimer, the term of this patent is extended or adjusted under 35 U.S.C. 154(b) by 271 days.

(21) Appl. No.: 12/419,073

(22) Filed: Apr. 6, 2009

(65) Prior Publication Data
US 2010/0254105 A1    Oct. 7, 2010

(51) Int. Cl.
*H05K 5/00* (2006.01)
(52) U.S. Cl. ........ 361/759; 361/728; 361/747; 361/802; 361/752
(58) Field of Classification Search .................. 361/759, 361/796, 752, 753, 747, 728, 802
See application file for complete search history.

(56) References Cited

U.S. PATENT DOCUMENTS

| 5,786,989 | A | * | 7/1998 | Kawabe | 361/759 |
|---|---|---|---|---|---|
| 5,978,232 | A | * | 11/1999 | Jo | 361/796 |
| 6,470,556 | B2 | * | 10/2002 | Boe | 29/450 |
| 6,761,273 | B1 | * | 7/2004 | Chen et al. | 211/41.17 |
| 6,771,512 | B2 | * | 8/2004 | Paquin et al. | 361/752 |
| 6,863,562 | B1 | * | 3/2005 | Jensen et al. | 439/571 |
| 7,554,815 | B2 | * | 6/2009 | Hardt et al. | 361/753 |
| 7,800,911 | B2 | * | 9/2010 | Rieger | 361/729 |

FOREIGN PATENT DOCUMENTS

| TW | 445023 | 7/2001 |
|---|---|---|
| TW | 501860 | 9/2002 |
| TW | 508049 | 10/2002 |
| TW | M290653 | 5/2006 |
| TW | I272042 | 1/2007 |
| TW | M304187 | 1/2007 |
| TW | M311220 | 5/2007 |
| TW | M329946 | 4/2008 |
| TW | M332139 | 5/2008 |
| TW | M333752 | 6/2008 |

* cited by examiner

*Primary Examiner* — Yuriy Semenenko
*Assistant Examiner* — Andargie M Aychillhum
(74) *Attorney, Agent, or Firm* — Winston Hsu; Scott Margo

(57) ABSTRACT

A printed circuit board fastening structure aims to fasten a printed circuit board which has a first bearing surface abutting and coupling on a casing and a second bearing surface. The first bearing surface is coupled with at least one support member. The support member has at least one leg connecting to the first bearing surface and an end portion formed with a fastening hole. The end portion is adjacent to the casing. A fastening element is provided to run through the casing from another side thereof to couple with the support member, thereby to fasten the printed circuit board to the casing.

9 Claims, 4 Drawing Sheets

PRINTED CIRCUIT BOARD FASTENING STRUCTURE

FIELD OF THE INVENTION

The present invention relates to a printed circuit board fastening structure for fastening a printed circuit board to a casing of an electronic device through at least one fastening element.

BACKGROUND OF THE INVENTION

A conventional power supply ought to have a bigger transformer, more capacitors and larger switches to provide a greater amount of current and power. To meet safety requirements, the circuit elements also have to be spaced from each other at a desired insulation distance, and provide sufficient space to disperse heat. All these make the printed circuit board holding the aforesaid circuit elements to be installed close to the casing of the power supply to better utilize the space while still maintain a safety distance from the casing. As the space between the printed circuit board and the casing usually is limited, installing the printed circuit board close to the casing is a tedious and time-consuming task.

To remedy the aforesaid problems, many techniques have been proposed in prior art. For instance, R.O.C. patent No. M290653 entitled "Printed circuit board fastening structure" provides at least one anchor strut beneath a printed circuit board and a bolt running through the printed circuit board to connect with the anchor strut. The printed circuit board is interposed between the bolt and the anchor strut. However, the bolt takes substantial space above the printed circuit board. Thus the circuit elements on the printed circuit board are even more crowded. Fastening installation also has to be performed manually inside the power supply. Hence it does not provide much improvement on printed circuit board fastening operation.

Another R.O.C. patent pub. No. 501860 entitled "Printed circuit board fastening structure" provides a plurality of spherical coupling elements each has an annular groove to be wedged by one of a plurality of anchor holes formed on a printed circuit board. And each spherical coupling element has a coupling portion connecting to a casing to anchor the printed circuit board. But wedging the printed circuit board in the annular groove of the spherical coupling element is troublesome. In the event that there is a fabrication error on the spherical coupling elements and the anchor holes, coupling them is even more difficult. Moreover, the spherical coupling elements also have to be installed inside the power supply and fastened to the printed circuit board from an inner side towards the outer side. All these create a lot of problems for manual installation.

Yet another R.O.C. patent No. M311220 entitled "Printed circuit board fastening structure" has a printed circuit board with a plurality of anchor holes formed thereon. Each of the anchor holes has a notch of varying diameters. A plurality of anchor elements are provided to be wedged in the notches to form anchoring. But the anchor elements could be loosened off from the notches. Hence it also provides an elastic detent unit to enhance anchoring of the printed circuit board. Such an approach requires forming the notches on the printed circuit board at a greater size, and results in wasting of the precious area of the printed circuit board. To prevent loosening off, an extra ancillary mechanism has to be provided to anchor the printed circuit board. Hence it also has the drawbacks of wasting space and higher cost.

Other similar techniques can be found in R.O.C. patent publication Nos. 445023 and 508049, and R.O.C. patent Nos. M304187, M329946, M332139 and M333752. They all have the problems mentioned above, such as occupying more space, higher costs, and difficult installation from the inner side to the outer side. There are still rooms for improvement.

SUMMARY OF THE INVENTION

Therefore, the primary object of the present invention is to provide a printed circuit board fastening structure that can reduce cost and save installation time to facilitate manual installation of the printed circuit board to overcome the disadvantages of the conventional techniques.

The printed circuit board fastening structure according to the invention has a printed circuit board formed with a first bearing surface abutting a casing and a second bearing surface. The first bearing surface is coupled with at least one support member which has at least one leg connecting to the first bearing surface and an end portion with a fastening hole formed thereon. The end portion is adjacent to the casing. A fastening element is provided to run through the casing from another side to couple with the anchor hole. Hence fastening can be done by running the fastening element through the casing from the outer side thereof to couple with the support member, then the printed circuit board can be anchored on the casing. The invention mainly aims to fasten the printed circuit board of electronic devices. The electronic devices may be power supply. The casing may be a housing of a power supply. Through the invention, operators can fasten the printed circuit board at one side (namely the outer side of the casing) where more space is available. It eliminates the problem of the conventional techniques that do installation in a smaller space inside the casing. Moreover, the support member is connected to the first bearing surface without occupying the second bearing surface of the printed circuit board, hence the second bearing surface has a sufficient area to accommodate circuit elements or facilitate heat dissipation.

In short, the invention provides at least the following benefits:
1. Simpler structure and lower cost.
2. Installation is performed on a roomier side of the printed circuit board, thus is easier.
3. More space can be saved on the second bearing surface to accommodate more circuit elements or facilitate heat dissipation.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
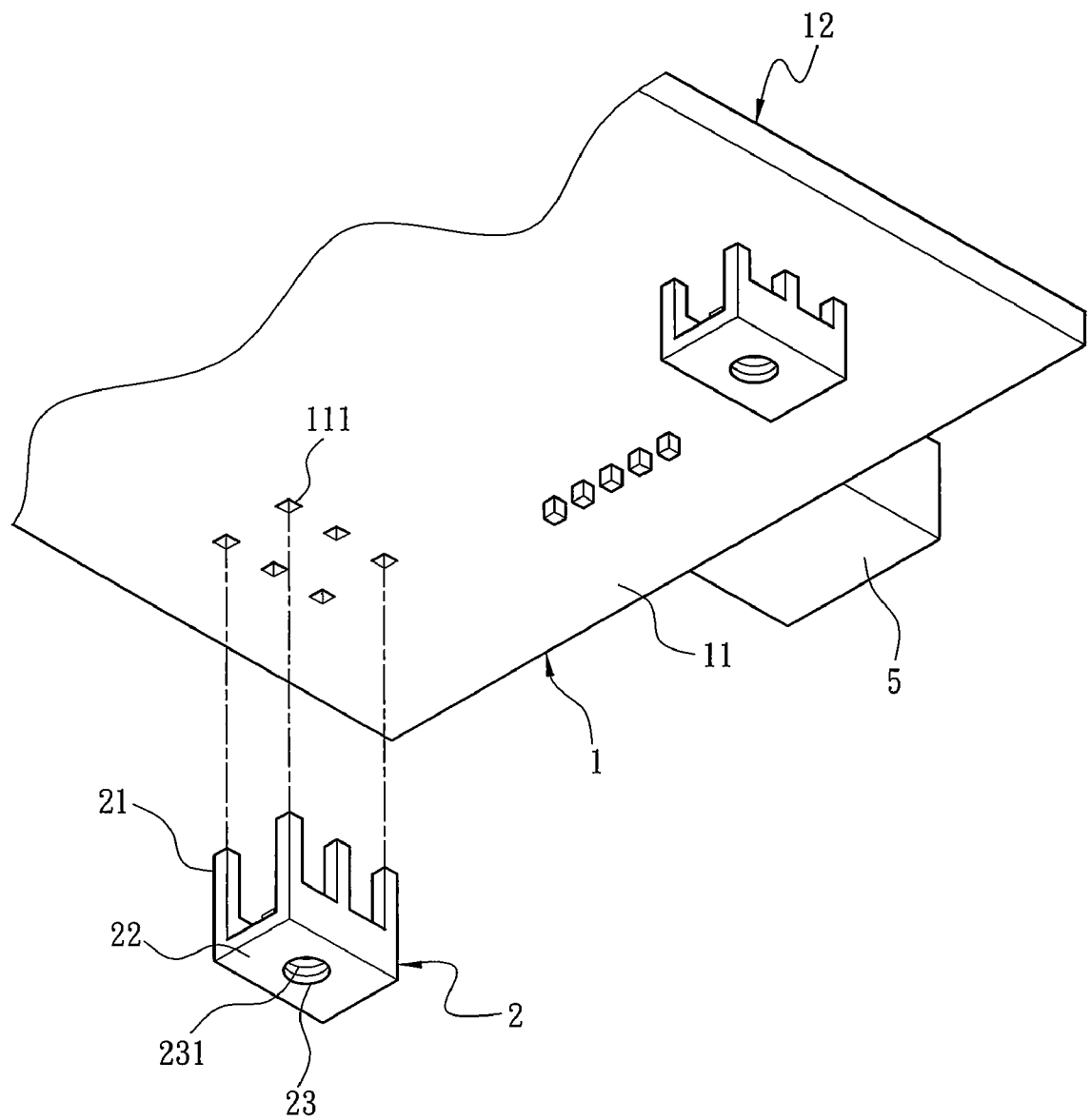
FIG. 1 is an exploded view of a printed circuit board and a support member of the invention.
Figure 2:
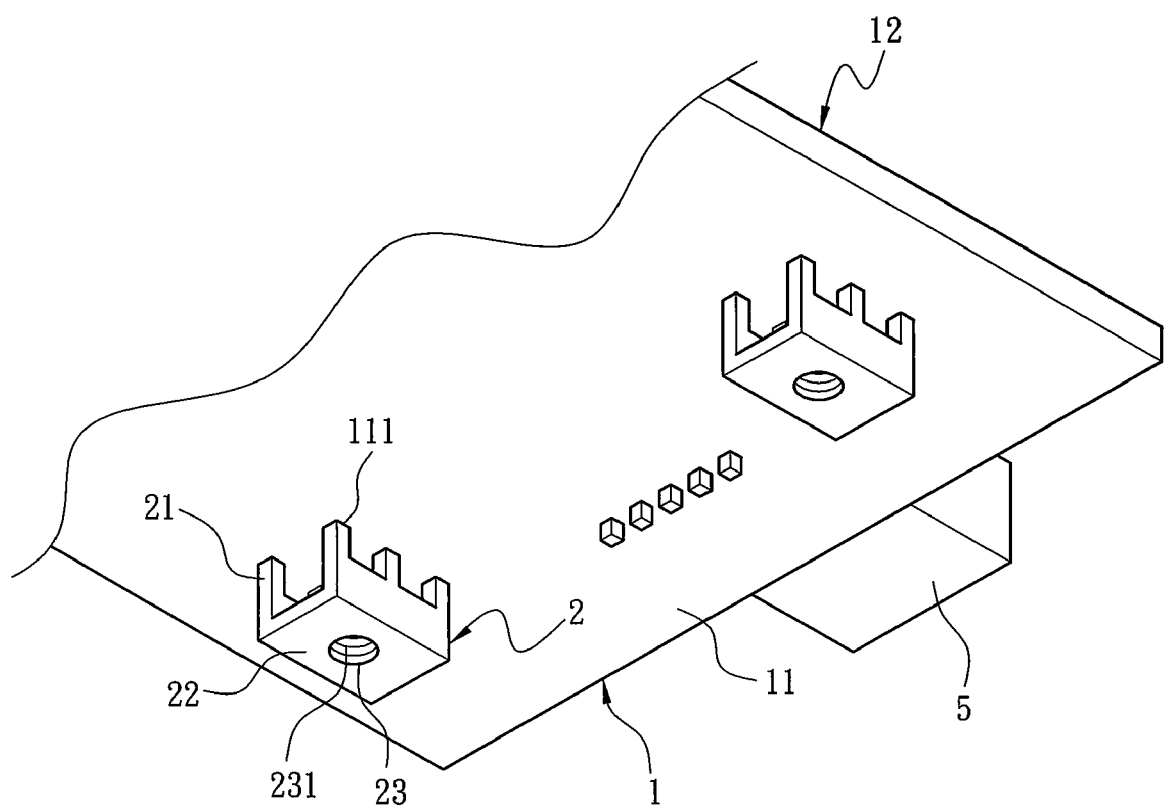
FIG. 2 is a schematic view of the invention showing the printed circuit board and support member in a coupling condition.

The present invention aims to provide a printed circuit board fastening structure. Please refer to FIG. 1, a printed circuit board 1 and at least one support member 2 are provided. The printed circuit board 1 has a first bearing surface 11 abutting a casing 3 (also referring to FIG. 3) of an electronic device and a second bearing surface 12. There is a larger space above the second bearing surface 12, hence a plurality of bulkier circuit elements 5 (an input port is shown in the drawings as an example) such as input ports, transformers, capacitors, integrated circuits, heat sinks and the like can be installed on the second bearing surface 12. The first bearing surface 11 is located on another side opposite to the second bearing surface 12. Although the first bearing surface 11 is closer to the casing 3 and results in a smaller space, other smaller circuit elements 5 (such as integrated circuits, semiconductor elements and the like) still can be installed thereon. The first bearing surface 11 is coupled with at least one support member 2. The support member 2 has at least one leg 21 and an end portion 22. The leg 21 may be soldered on the first bearing surface 11 or wedged in an aperture 111 preformed on the first bearing surface 11 by compacting, or by compacting in the aperture 111 first then soldering. The coupling approaches of the leg 21 on the first bearing surface 11 previously discussed are merely embodiment examples for reference, but not the limitation of the invention. The end portion 22 has a coupling surface to support the printed circuit board 1 on the casing 3 (also referring to FIGS. 3 and 4). The end portion 22 is formed at a sufficient thickness and the coupling surface has a fastening hole 23 formed thereon with a screw thread 231 inside. Most of the circuit elements 5 are installed on the second bearing surface 12, hence the first bearing surface 11 can be coupled with a plurality of the support members 2 as shown in FIG. 2.

Figure 3:
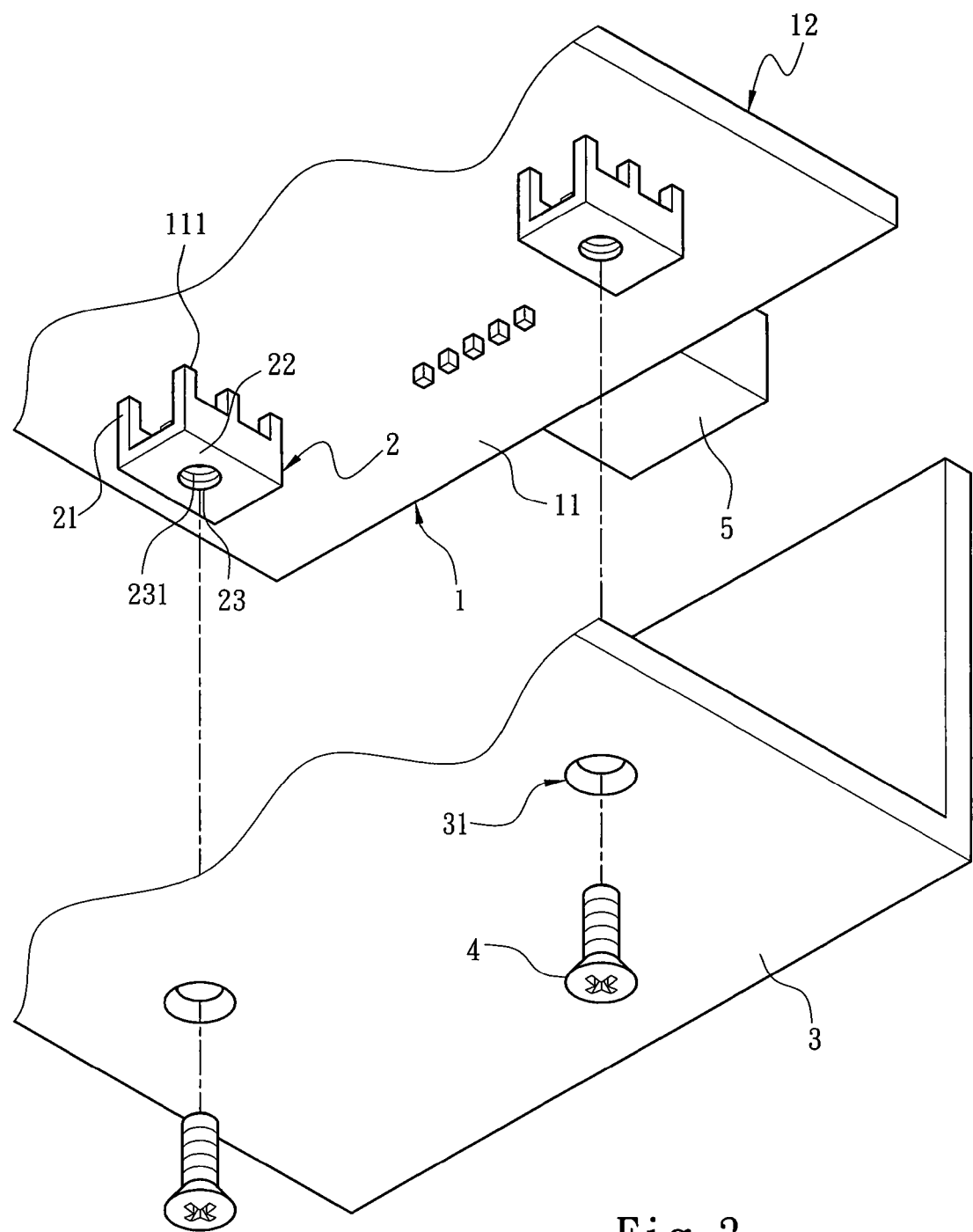
FIG. 3 is a schematic view of the invention showing the support member and the casing in an installing condition.
Figure 4:
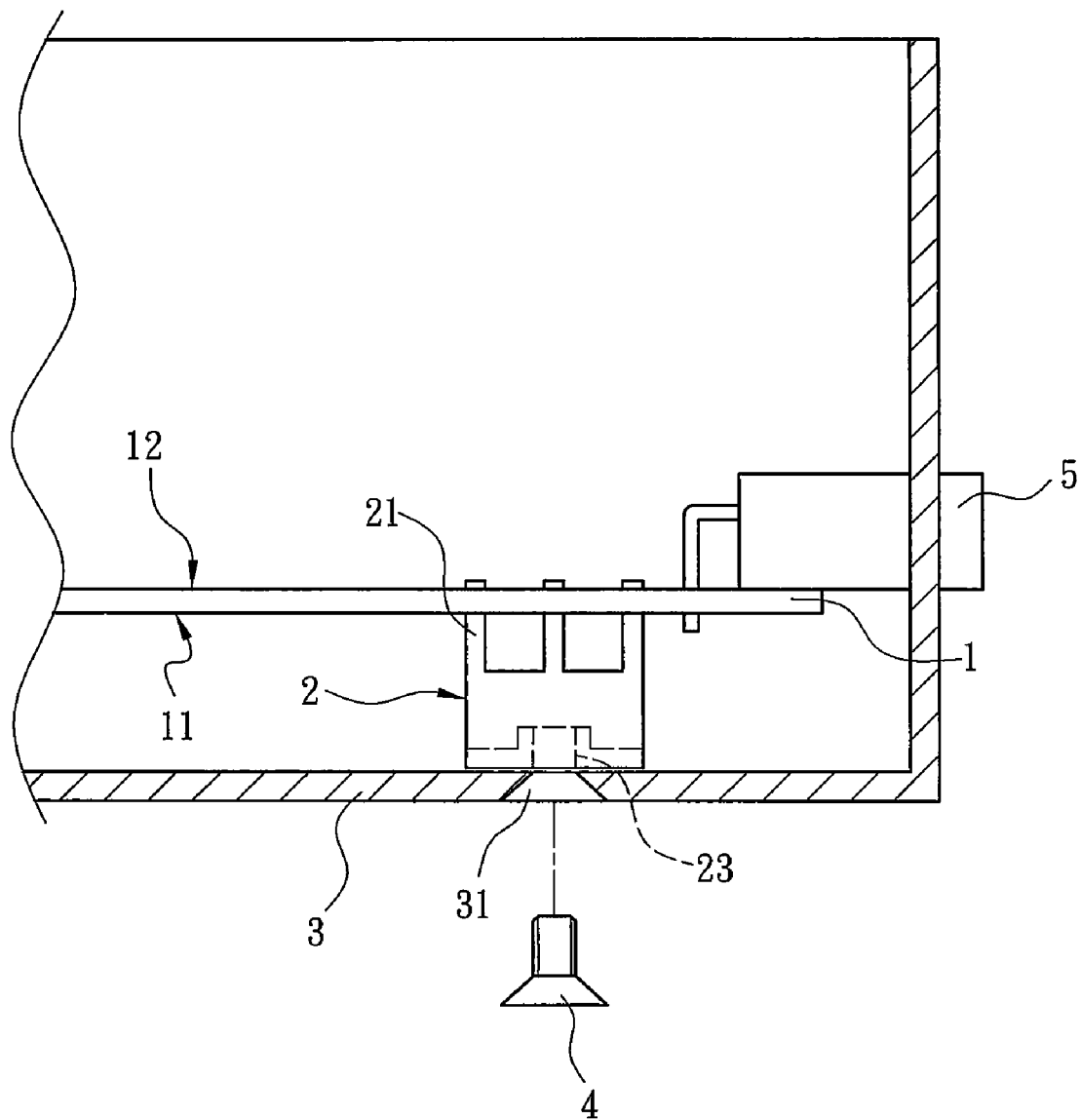
FIG. 4 is a schematic view of the invention showing the printed circuit board and the casing in a coupling condition.

Referring to FIG. 3, the printed circuit board 1 is fastened to the casing 3 which may be a housing of a power supply. The end portion 22 has the coupling surface in contact with the casing 3 so that the end portion 22 abutting the casing 3. The casing 3 has an orifice 31 corresponding to the fastening hole 23. A fastening element 4 is provided to run through the casing 3 from another side to couple with the fastening hole 23. The fastening element 4 may be a screw to be fastened to the screw thread 231 of the fastening hole 23, as shown in FIG. 4. Therefore, the printed circuit board 1 can be mounted onto the casing 3 through the support member 2 with the fastening element 4 coupling to the support member 2 from the outer side of the casing 3. Such an approach allows the printed circuit board 1 to be firmly coupled to the casing 3 from a roomier side directing inwards. Hence installation is easier. Moreover, the structure of the invention also is simpler and can be fabricated at a lower cost. The fastening structure of the invention also consumes little space of the second bearing surface 12, thus the second bearing surface 12 has more space to be utilized more flexibly.

While the preferred embodiments of the invention have been set forth for the purpose of disclosure, they are not the limitations of the invention. For instance, the coupling approaches of the printed circuit board 1 and the support member 2 are not limited to the embodiments set forth above. Coupling of the fastening element 4 and the support member 2 also is not restricted to the embodiment previously discussed. For instance, the fastening element 4 may be a nail type element with an inverse hook at a distal end to be sunk in the casing 3 from the outer side to latch on the support member 2. Thus modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A printed circuit board fastening structure to fasten a printed circuit board which has a second bearing surface and a first bearing surface abutting a casing of a power supply, comprising:
    at least one one-piece formed conductive support member which is coupled on the first bearing surface and has at least one leg connecting to the first bearing surface and an end portion which is integrated with the leg monolithically and has a fastening hole; and
    a fastening element running through the casing from another side thereof to couple with the fastening hole so as to let the end portion of the support member directly contact the casing and the support member be affixed to the casing for transmitting high current from the printed circuit board to the casing for grounding.

2. The printed circuit board fastening structure of claim 1, wherein the end portion has a coupling surface in contact with the casing, the fastening hole being formed on the coupling surface.

3. The printed circuit board fastening structure of claim 1, wherein the leg of the supporter member is soldered on the printed circuit board.

4. The printed circuit board fastening structure of claim 1, wherein the fastening element is a nail type article having a distal end formed an inverse hook.

5. The printed circuit board fastening structure of claim 4, wherein the casing has an orifice corresponding to the fastening hole.

6. The printed circuit board fastening structure of claim 1, wherein the end portion is formed at a selected thickness to allow a screw thread formed on an inner side of the fastening hole, the fastening element is a screw.

7. The printed circuit board fastening structure of claim 6, wherein the casing has an orifice corresponding to the fastening hole.

8. The printed circuit board fastening structure of claim 1, wherein the leg of the support member is wedged in an aperture performed on the first bearing surface.

9. The printed circuit board fastening structure of claim 8, wherein the leg of the support member is soldered on the printed circuit board.

* * * * *